United States Patent
Campbell (10) Patent No.: US 6,265,304 B1
(45) Date of Patent: Jul. 24, 2001

(54) CONTROLLING AN ETCHING PROCESS OF MULTIPLE LAYERS BASED UPON THICKNESS RATIO OF THE DIELECTRIC LAYERS

(75) Inventor: William Jarrett Campbell, Austin, TX (US)

(73) Assignee: Advanced Micron Devices, Inc., Austin, TX (US)

( * ) Notice: Subject to any disclaimer, the term of this patent is extended or adjusted under 35 U.S.C. 154(b) by 0 days.

(21) Appl. No.: 09/412,215

(22) Filed: Oct. 5, 1999

(51) Int. Cl.[7] .................... H01L 21/4763; H01L 21/302; H01L 21/461

(52) U.S. Cl. .......................... 438/624; 257/758; 257/760; 257/374; 438/618; 438/738; 438/735; 438/757; 438/761; 438/791; 438/957; 156/345; 216/59; 216/61; 216/84; 216/86

(58) Field of Search ................ 257/758–60, 374; 438/618, 724–47, 757–61, 791, 957; 156/345; 216/59–61, 84–86

(56) References Cited

U.S. PATENT DOCUMENTS

| | | | |
|---|---|---|---|
| 4,481,061 | * 11/1984 | Ross | 156/345 |
| 5,282,925 | * 2/1994 | Jeng et al. | 156/646 |
| 5,334,861 | * 8/1994 | Pfiester et al. | 257/67 |
| 5,514,624 | * 5/1996 | Morozumi | 437/195 |
| 5,677,222 | * 10/1997 | Tseng | 437/52 |
| 5,693,178 | * 12/1997 | Chan et al. | 156/627.1 |
| 5,726,100 | * 3/1998 | Givens | 438/702 |
| 5,770,878 | * 6/1998 | Beasom | 257/330 |
| 5,869,880 | * 2/1999 | Grill et al. | 257/522 |
| 6,004,883 | * 12/1999 | Yu et al. | 438/706 |
| 6,016,000 | * 1/2000 | Moslehi | 257/522 |

FOREIGN PATENT DOCUMENTS

0801426 A2 * 3/1997 (EP) ..................... 29/78

* cited by examiner

Primary Examiner—Matthew Smith
Assistant Examiner—Granville D Lee, Jr.
(74) Attorney, Agent, or Firm—Williams, Morgan & Amerson, P.C.

(57) ABSTRACT

The present invention is directed to a method of forming conductive interconnections in an integrated circuit device. In one embodiment, the method comprises forming a dielectric stack comprised of multiple layers, and determining a thickness ratio of the layers of the stack. The method further comprises determining an etching process to be performed on the dielectric stack to define an opening for a conductive interconnection based upon the determined thickness ration, and performing the determined etch process on the dielectric stack.

38 Claims, 4 Drawing Sheets

CONTROLLING AN ETCHING PROCESS OF MULTIPLE LAYERS BASED UPON THICKNESS RATIO OF THE DIELECTRIC LAYERS

BACKGROUND OF THE INVENTION

1. Field of the Invention

The present invention is directed to the field of semiconductor processing, and, more particularly, to a method of controlling an etching process used on multiple dielectric layers on a semiconductor device.

2. Description of the Related Art

There is a constant drive to reduce the size, or scale, of transistors to increase the overall speed of the transistor, as well as integrated circuit devices incorporating such transistors. A conventional integrated circuit device, such as a microprocessor, is typically comprised of many millions of transistors formed above the surface of a semiconducting substrate. For the integrated circuit device to function, the transistors must be electrically connected to one another through conductive interconnections.

Many modern integrated circuit devices are very densely packed, i.e., there is very little space between the transistors formed above the substrate. Thus, these conductive interconnections are typically made in multiple layers to conserve plot space on the semiconducting substrate. This is typically accomplished through the formation of a plurality of conductive lines and conductive plugs formed in alternating layers on the device. As is readily apparent to those skilled in the art, the conductive plugs are means by which various layers of conductive lines, and/or semiconductor devices, may be electrically coupled to one another. The conductive lines and plugs may be made of a variety of conductive materials, such as copper, aluminum, aluminum alloys, titanium, tantalum, titanium nitride, tantalum nitride, tungsten, etc.

One problem associated with modern integrated circuit devices is that, due to the reduced size of transistors and the very dense packing of transistors on an integrated circuit device, there is an increase in the capacitance between conductive lines formed on the integrated circuit device. The increased capacitance is undesirable because it slows down the operating speed of the integrated circuit device. This line-to-line capacitance is directly proportional to the distance between adjacent lines as well as the dielectric constant of the material positioned between the adjacent conductive lines. In the densely packed integrated circuits of today, the distance between the various conductive lines is inherently small and increasing that distance is impractical. Thus, in an effort to reduce the line-to-line capacitance, efforts have been made to position material between the adjacent lines that has a relatively low dielectric constant, e.g., a material having a dielectric constant less than approximately four. These materials are sometimes referred to as low-k dielectric materials and include materials such as silane based dielectrics, etc.

However, some of the low-k dielectric materials tend to be non-conformal when deposited. Therefore, a second layer of a dielectric material that is more conformal and tends to produce a flatter surface, e.g., TEOS, is formed above the low-k dielectric layer. Thereafter, openings for conductive interconnections, e.g., lines or contacts, are formed through both the low-k dielectric layer and the second dielectric layer. For example, a via may be formed above a conductive line for a conductive contact that will be electrically coupled to the conductive line below.

The etch rate of the low-k dielectric layers and the second dielectric layers are typically different. For example, a low-k dielectric material may etch at a faster rate than other types of dielectric materials, e.g., TEOS. As a result, problems may arise when the low-k dielectric layer and the second dielectric layer are made to thickness other than the design thickness of such layers, i.e., when the thickness ratio of the layers is other than the ratio anticipated by the design process. A variation in the thickness of each of those layers as compared to the design thickness of each of those layers can have an adverse impact on transistor manufacturing. For example, in the case where the low-k dielectric is thicker than anticipated, performing an etching process based on the assumed design thickness of these layers may be too aggressive. In the described situation, due to variations in the thickness of the layers, the overall etch rate for both layers is faster than the rate anticipated by the design process. This may lead to several problems, such as damage to the underlying structure, oversizing a particular feature defined by the etching process, etc.

Conversely, another situation to consider is when the second dielectric layer, the layer with the slower etch rate, is thicker than anticipated by the design process and the low-k dielectric layer is thinner than the design thickness of that layer. In that situation, performing a standard etching process that is based upon the assumed design thickness of those layers, may result in insufficient etching, i.e., the feature may not be completely defined because of the increased thickness of the second dielectric layer. In effect, the overall etch rate is slower than anticipated by the design process. This situation may lead to costly and time consuming re-work to properly define the desired features, i.e., additional etching may need to be performed.

The present invention is directed to a method of manufacturing a semiconductor device that minimizes or reduces some or all of the aforementioned problems.

SUMMARY OF THE INVENTION

The present invention is directed to a method of controlling an etching process used to form conductive interconnections on an integrated circuit device. In one illustrative embodiment, the method comprises forming a dielectric stack comprised of multiple layers, and determining a thickness ratio of the layers of the stack. The method further comprises determining an etching process to be performed on the dielectric stack to define an opening for a conductive interconnection based upon the determined thickness ration, and performing the determined etch process on the dielectric stack.

In yet another illustrative embodiment, the method disclosed herein comprises forming a dielectric stack comprised of multiple layers, each layer having a design thickness, and determining a variation in the thickness of the layers as compared to a design thickness of the layers. The method further comprises determining an etching process to be performed on the dielectric stack to define an opening for a conductive interconnection based upon the determined thickness variation, and performing the determined etching process on the dielectric stack.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–5. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to determining an etching process to be used on a dielectric stack comprised of multiple layers to form openings for conductive interconnections in the dielectric stack based upon the thicknesses of the layers that comprise the stack. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

Figure 1:
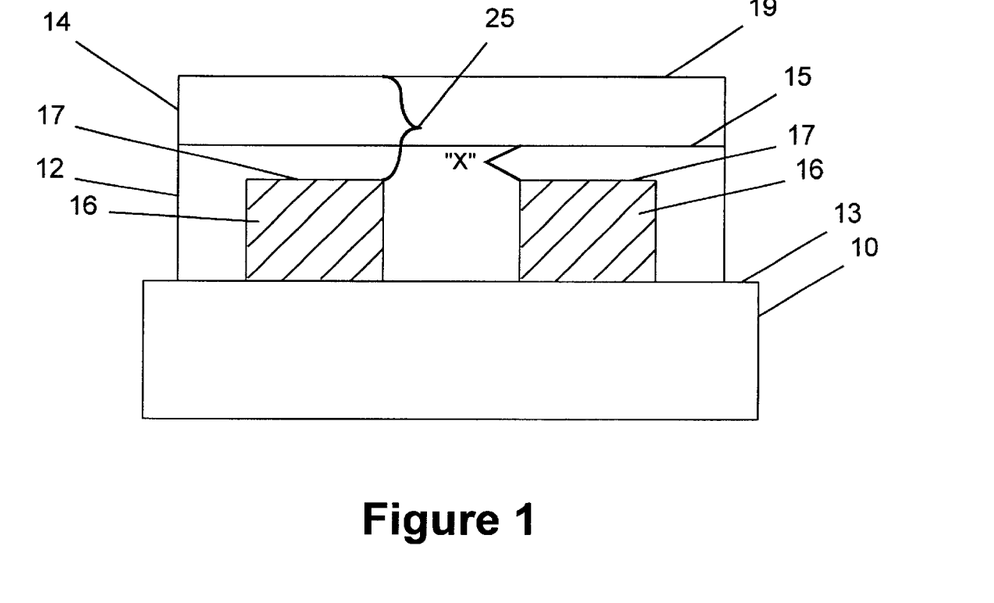
FIG. 1 is a cross-sectional view of a plurality of conductive lines formed above an underlying structure.

As shown in FIG. 1, a plurality of conductive lines 16 are formed above a structure 10. Further, a first dielectric layer 12 is formed above the structure 10 and over the conductive lines 16, and a second dielectric layer 14 is formed above the first dielectric layer 12.

The structure 10 may be any type of structure. For example, the structure 10 may be a previous layer of conductive interconnections formed on an integrated circuit device, a semiconducting substrate in which multiple transistors are formed, etc.

The conductive lines 16 may be comprised of any material useful for such purpose, and the lines 16 may be formed using a variety of known techniques. For example, the conductive lines 16 may be comprised of a metal, such as aluminum or copper, and they may be formed by depositing a layer of the appropriate material, (not shown), e.g., aluminum, and patterning the layer of metal using traditional photolithography and etching processes to define the conductive lines 16. Alternatively, although not depicted in FIG. 1, the conductive lines 16 may also be formed by a damascene process.

The first dielectric layer 12 may be comprised of any dielectric material. In one illustrative embodiment, the first dielectric layer 12 is a low-k dielectric material, i.e., a material having a dielectric constant less than approximately four. For example, the first dielectric layer 12 may be comprised of a silane based material made using an HDP process. Additionally, the first dielectric layer 12 may be formed by any of the variety of known techniques for forming such layers, e.g., chemical vapor deposition.

Similarly, the second dielectric layer 14 may be comprised of any dielectric material, e.g., silicon dioxide, TEOS, or other silane based dielectrics. Typically, the material selected for the second dielectric layer 14 will tend to be conformal and produce a relatively flat surface when formed. The second dielectric layer 14 may also be formed by any of a variety of techniques used for forming such layers, e.g., deposition.

Figure 2:
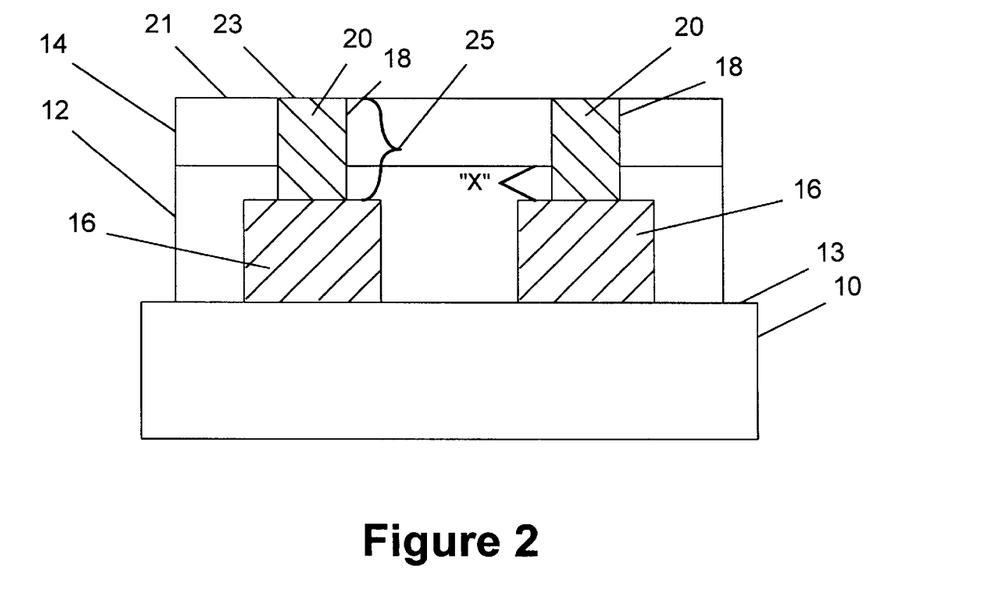
FIG. 2 is a cross-sectional view of the device depicted in FIG. 1 after an illustrative contact opening and contact have been formed above the conductive lines.

Next, as shown in FIG. 2, a plurality of contacts 20 are formed above the conductive lines 16 in openings 18. As with the conductive lines 16, the contacts 20 may be comprised of any conductive material, e.g., aluminum, copper. Moreover, the contacts 20 may be formed by any known techniques for forming such contacts 20. For example, a layer of metal (not shown), e.g., aluminum, may be deposited into the openings 18 and above the second dielectric layer 14 and thereafter, be subjected to a planarization operation. The contacts 20 may also be formed using a single damascene process flow, although that particular process flow is not depicted in FIGS. 1 and 2.

One illustrative process flow for the device depicted in FIGS. 1 and 2 will now be described. Initially, a structure 10 is provided that is comprised of a previous layer of conductive interconnections on an integrated circuit device. A layer of metal (not shown) comprised of aluminum is then blanket-deposited above a surface 13 of the structure 10, and patterned using traditional photolithography and etching processes to define the conductive lines 16. Thereafter, a first dielectric layer 12 comprised of HDP is formed above the surface 13 of the structure 10 and over the conductive lines 16 by a chemical vapor deposition process. In one illustrative embodiment, the first dielectric layer comprised of HDP may have a thickness ranging from approximately 6,000–10,000 Å. Note that, in the illustrative process flow depicted in FIGS. 1 and 2, a surface 15 of the first dielectric layer 12 extends above a top surface 17 of the conductive lines 16. A planarization operation, e.g., chemical mechanical polishing, may or may not be performed on the surface 15.

Thereafter, the second dielectric layer 14 comprised of TEOS is formed above the surface 15 of the first dielectric layer 12. In one illustrative embodiment, the second dielectric layer comprised of TEOS may have a thickness ranging from approximately 10,000–14,000 Å. The surface 19 of the second dielectric layer 14 may then be subjected to one or more planarization operations, e.g., a chemical mechanical polishing operation. A plurality of openings 18 are then formed above the conductive lines 16 using known photolithography and etching processes. Note that, during this process, the openings 18 are formed through the second dielectric layer 14, comprised of TEOS, and a portion of the first dielectric layer 12, comprised of HDP, above the conductive lines 16. The second dielectric layer 14 and the portion of the first dielectric layer 12 through which the openings 18 for a conductive interconnection, e.g., a conductive contact 20, is to be formed, may be considered to constitute a dielectric stack 25 comprised of multiple layers of dielectric material.

Next, the contacts 20 comprised of aluminum, for example, are formed by blanket-depositing a layer of aluminum (not shown) into the openings 18 and on to a surface 21 of the second dielectric layer 14, and performing a chemical mechanical polishing operation such that a surface 23 of the contact 20 is approximately planar with the surface 21 of the second dielectric layer 14.

The etching process used to form openings 18 in the dielectric layers 12, 14 for the conductive interconnections is a matter of design choice. For example, the etching process may involve a time-based etch procedure as well as an end point etch process. Alternatively, the etching process may involve only a time-based etch procedure. Thus, the particular etching process used to form the openings 18 for the conductive interconnections in the multiple layers 12, 14 of dielectric materials should not be considered a limitation of the present invention.

Previously, an etching process to be performed on the multiple layers 12, 14 of dielectric materials, e.g., dielectric stack 25, to define the openings 18 for conductive interconnections was selected based upon the assumption that the first and second dielectric layers 12 and 14, were each made to their respective design thicknesses. However, due to the inherent variation in etching rates of the materials used to make the first and second dielectric layers 12, 14, if the thicknesses of either of the process layer 12, 14 were different from their respective design thicknesses, then problems could occur in etching the openings 18.

For example, where the first dielectric layer 12 is comprised of HDP and the second dielectric layer 14 is comprised of TEOS, the HDP layer 12 will etch at a faster rate than will the layer 14 of TEOS. In the situation where the HDP layer 12 is thicker, and the TEOS layer 14 is thinner, than their respective design thicknesses, performing an etching process based upon the assumed design thickness of these layers 12, 14 may be problematic in that the selected etch process may be too aggressive. This may result in damage to the underlying structure, e.g., the conductive line 16, or in over-etching of a particular feature, e.g., the opening 18. Conversely, in situations where the dielectric layer with the slower etch rate is thicker, and the dielectric layer with the faster etch rate is thinner, than their respective design thicknesses, performing a standard etch process that is based upon the assumed design thickness, or ratio of design thicknesses of these layers, may result in incomplete etching of the particular feature. That is, the overall etching rate of both of the dielectric layers is slower than anticipated due to the extra thickness of the dielectric layer comprised of a material with slower etch rate.

Figure 3:
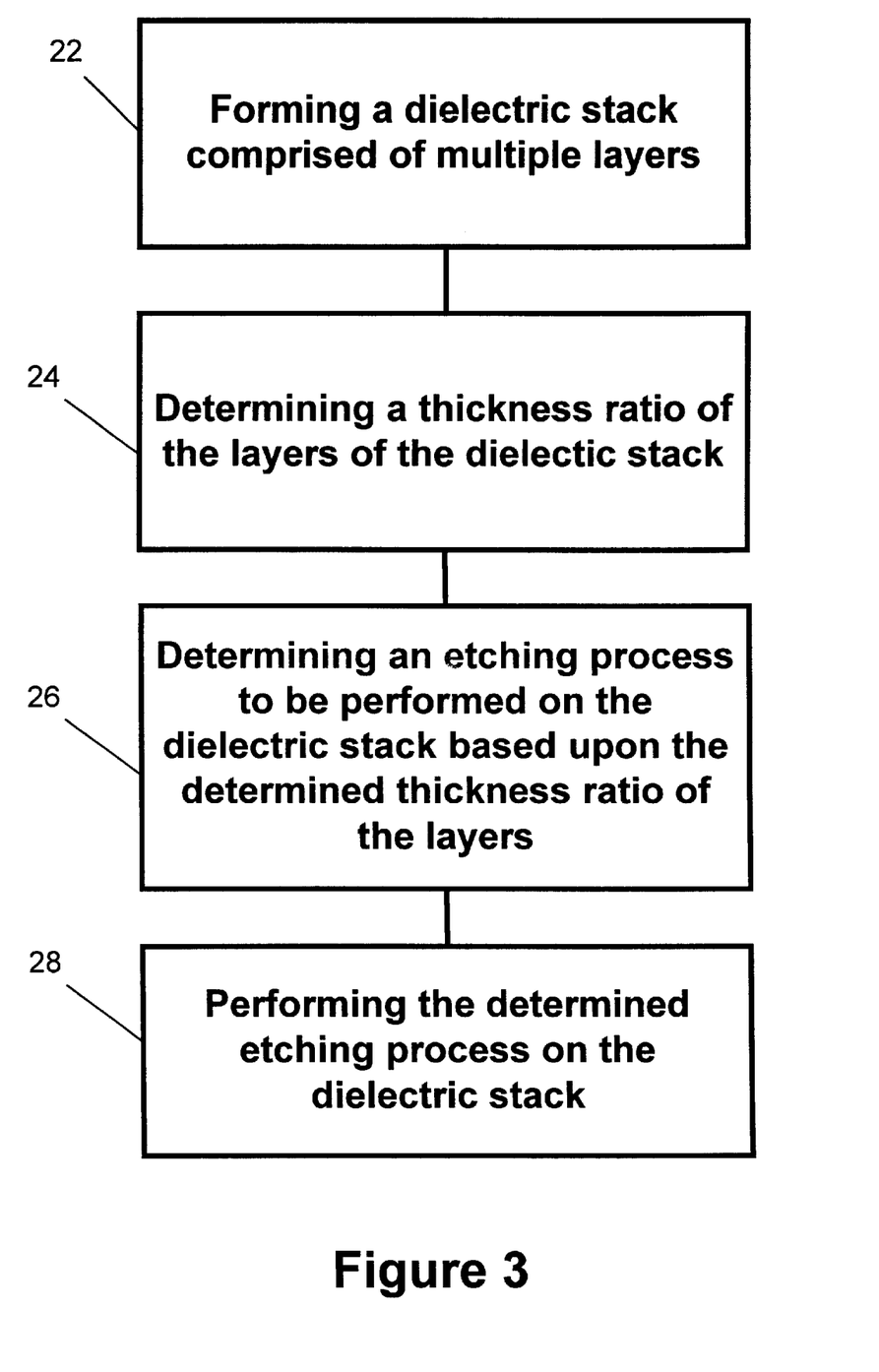
FIG. 3 is a flowchart depicting one illustrative embodiment of the present invention.

One illustrative embodiment of the present invention is depicted in flow chart form in FIG. 3. As shown therein, the method comprises forming a dielectric stack comprised of multiple layers, as indicated at block 22, and determining a thickness ratio of said layers of said dielectric stack, as indicated at block 24. The method further comprises determining an etching process to be performed on the dielectric stack based upon the determined thickness ratio, as indicated at block 26, and performing the determined etching process on the dielectric stack, as referenced in block 28.

The step of forming a dielectric stack comprised of multiple layers, referenced in block 22, may be performed by any of a variety of techniques. For example, one or more of the layers may be formed by a deposition or thermal growing process, e.g., chemical vapor deposition, etc. Moreover, the layers comprising the dielectric stack may be formed to any desired thickness, and the layers may be of equal or unequal thicknesses.

The thickness ratios of the layers comprising the dielectric stack may be determined by a variety of techniques. The thickness of the dielectric layers that are of interest are the respective thickness of the layers in the region where the conductive openings for the conductive interconnections are to be formed. For example, with reference to the illustrative situation depicted in FIGS. 1 and 2, the opening 18 for the contact 20 will be formed through the entirety of the second dielectric layer 14 and through a thickness "X" of the first dielectric layer 12 that is positioned above the conductive line 16. Of course, the present invention is not limited to the particular circumstance depicted in FIGS. 1 and 2. Rather, the present invention may be employed in any situation where it is desired to form an opening for a conductive interconnection through multiple layers of dielectric materials. Thus, the thickness, and thickness ratios, of interest are the thicknesses of the multiple dielectric layer through which the opening for the conductive interconnection, e.g., a conductive line, will be formed.

Moreover, the respective thicknesses, or ratios of the thicknesses, of the multiple layers may be determined by a variety of techniques. For example, after the first dielectric layer 12 is formed above the conductive lines 16, multiple thickness measurements may be taken to directly measure the thickness "X" of the first dielectric layer 12 positioned above the conductive lines 16. Alternatively, the height of the conductive lines 16 above the surface 13 of the substrate 10 may be determined, and the overall thickness of the first dielectric layer 12, i.e., from surface 13 to surface 15 may also be determined. The relevant thickness "X" of the first dielectric layer 12 may thereafter be determined by calculation. The various measurements may be performed using an appropriate metrology tool, e.g., an ellipsometer. Thereafter, a ratio of the thickness of the layers may be determined by calculation or by reference to a table or database correlating the respective thicknesses of the layers to a ratio.

The step of determining an etch process to be performed on the dielectric stack based upon the thickness ratio determined at block 24, may also be performed by a variety of techniques. For example, a table or database correlating a thickness ratio of given types of materials to a particular etching process may be established. Moreover, the etching process referenced at block 24 may involve one or more distinct etching steps. For example, the etching process referenced at block 24 may be comprised of a timed base etch and an endpoint etch process. Additionally, the act of determining an etching process may involve determining at least one, and perhaps all, parameters of an etching process, or it may involve determining an adjustment to be made to a preselected etch process. For example, it may be determined that only the duration of the preselected etch process needs to be increased or decreased based upon the thickness ratio of the layers of the dielectric stack.

Moreover, the step of determining an etching process based upon thickness ratio of the multiple layers may be direct or indirect. For example, a composite etching rate for the entire gate stack 25 could be determined based upon the respective etch rates and thicknesses of individual layers. Thereafter, an etching process could be determined based upon this now determined composite etch rate. In this example, indirect use of the thickness ratio of the respect layer to determine the appropriate etching process also falls with in the scope of the present invention. Next, as indicated at block 28, the method comprises performing the determined etching process on the dielectric stack.

Figure 4:
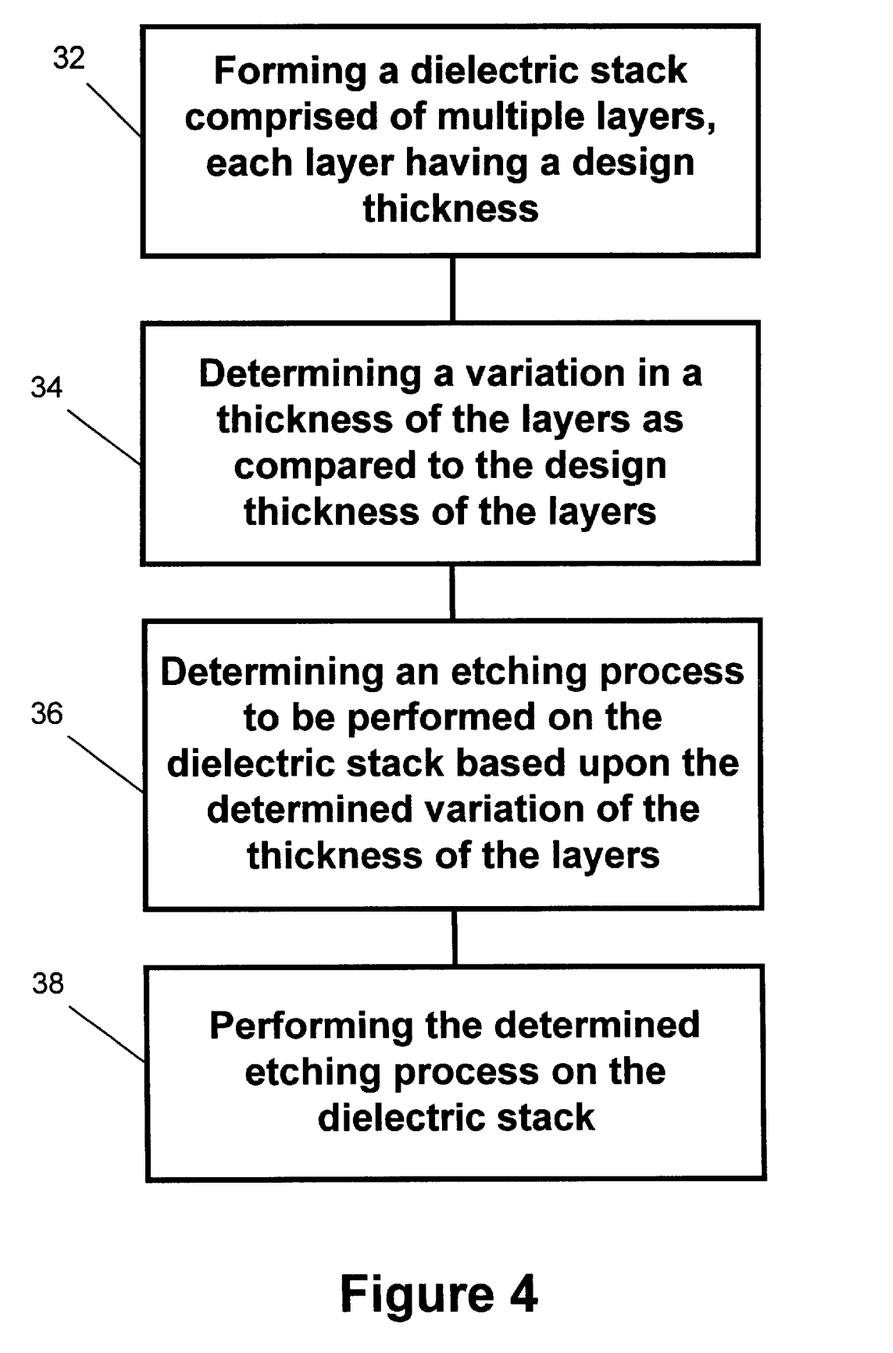
FIG. 4 is another flowchart depicting yet another illustrative embodiment of the present invention.

Another illustrative embodiment of the present invention is depicted in FIG. 4. As shown therein, the illustrative embodiment comprises forming a dielectric stack comprised of multiple layers, each of which have a design thickness, as indicated at block 32, and determining a variation in a thickness of the layers as compared to the design thickness of the layers as indicated at block 34. The method further comprises determining an etching process to be performed on the dielectric stack based upon the determined variation of the thickness of the layers comprising the stack, as referenced at block 36, and performing the determined etching process on the dielectric stack, as indicated at block 38.

As with the previous embodiment of the invention, the multiple layers comprising the dielectric stack may be made of a variety of material, and using a variety of processes for making such layers. Moreover, the etching process referenced in this particular embodiment of the invention may comprise one or more etching processes, e.g., a timed base etch and an end-point etch.

The step of determining a variation in a thickness of the layers as compared to a design thickness of the layers may by made using a variety of techniques. For example, multiple thickness measurements of each of the layers may be made using an appropriate metrology tool, e.g., an ellipsometer. Moreover, the thickness variation of a dielectric layer, as compared to the design thickness of the layers, may be expressed as a absolute thickness of the process layer or a differential thickness of the measured dielectric layer as compared to the design thickness of the layer. Once determined, this variation may be used, directly or indirectly, to determine an etching process to be used on the dielectric stack.

The present invention may also be embodied in a machine or computer readable format, e.g., an appropriately programmed computer, a software program written in any of a variety of programming languages. The software program would be written to carry out various functional operations of the present invention, such as those indicated in FIGS. 3 and 4, and elsewhere in the specification. Moreover, a machine or computer readable format of the present invention may be embodied in a variety of program storage devices, such as a diskette, a hard disk, a CD, a DVD, a nonvolatile electronic memory, or the like. The software program may be run on a variety of devices, e.g., a processor.

Figure 5:
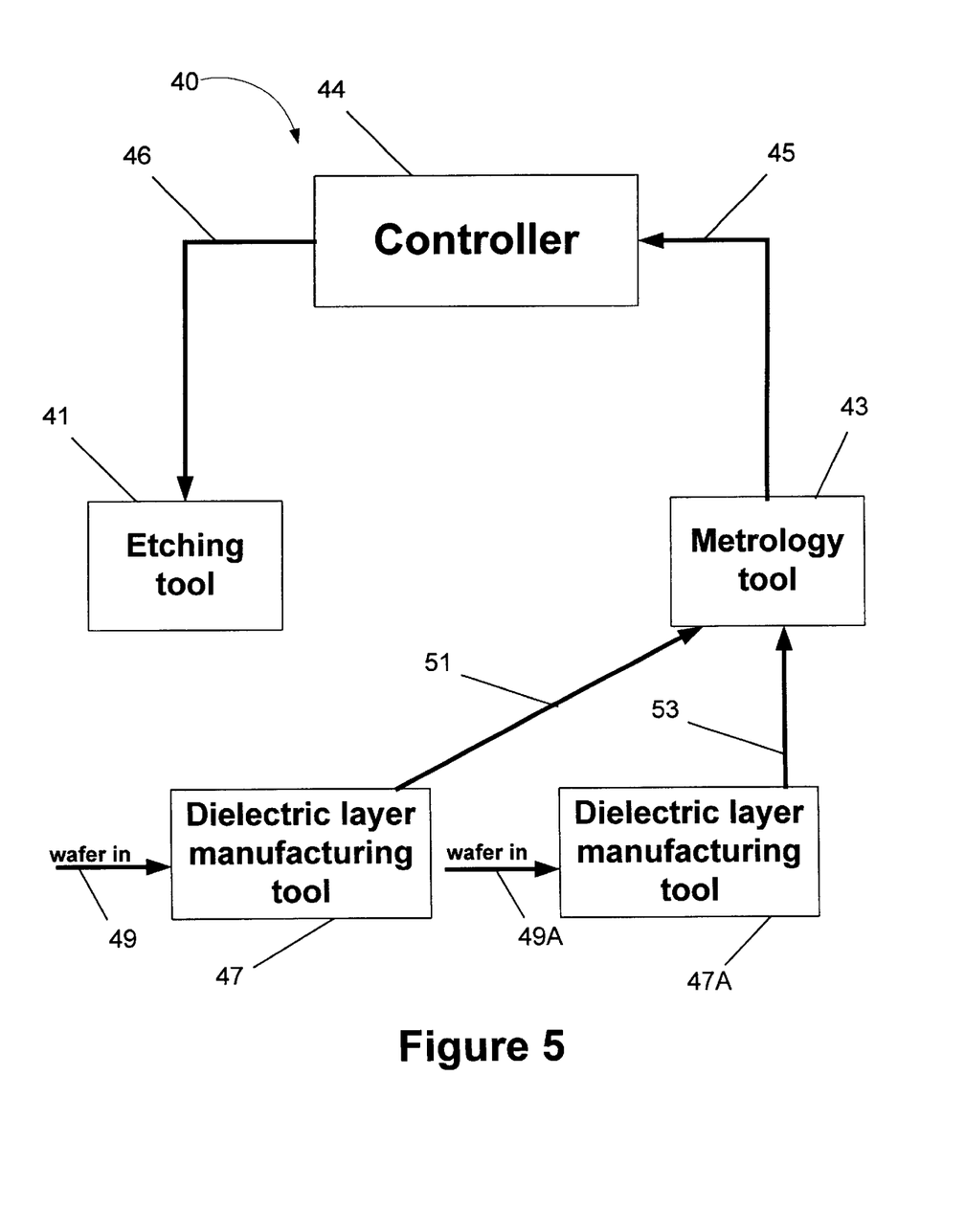
FIG. 5 is an illustrative embodiment of a system that may be used with the present invention.

The present invention is also directed to a processing system, e.g., a processing tool or combination of processing tools, for accomplishing the present invention. As shown in FIG. 5, an illustrative system 40 is comprised of an etching tool 41, multiple dielectric layer manufacturing tools 47, 47A, a metrology tool 43, and a controller 44. In the illustrative system depicted in FIG. 5, the dielectric layer manufacturing tools 47, 47A, may be used to make the first dielectric layer 12, and second dielectric layer 14, respectively. Although schematically depicted as separate tools in FIG. 5, the tools 47, 47A could be multiple chambers of a cluster tool used to make dielectric layers. Moreover, the system depicted in FIG. 5 could be comprised of only one tool that may be used to manufacturer both of the dielectric layers comprising the dielectric stack.

In one illustrative process flow, a wafer is positioned in tool 47 and the first dielectric layer 12 is formed on the wafer in tool 47. The appropriate thickness measurements of the layer 12 are taken using the metrology tool 43, as indicated by line 51, e.g., dimension "X" shown in FIG. 1 is determined using the metrology tool 43. Next, the wafer moves on to tool 47A where dielectric layer 14 is formed. At this point, the dielectric layer 14 may be subjected to one or more planarization operations. Thereafter, the appropriate thickness of the second dielectric layer 14 is determined using the metrology tool 43. The thickness measurements referenced above may be made in multiple locations for each layer, and they may be made by any appropriate metrology tool 43, e.g., an ellipsometer.

The results obtained by the metrology tool 43 may then be sent to the controller 44 via input line 45. In turn, the controller 44 may send commands to the etching tool 41 to select an etching process or to adjust or vary one or more parameters of an etching process to be used on the dielectric stack to form openings for conductive interconnections. For example, the controller 44 may send commands to the etching tool 41 to vary the time duration of a base etch to compensate for changes in the thickness of one or more of the layers that comprise the dielectric stack, as compared to the design thickness of those layers, or the ratio of the thickness of the layers. The command from the controller 44 may be based upon calculations made in the controller, or based upon a database containing information correlating the desired etching process or adjustments to a preselected process to thickness variations of the layers as comprised to the design thickness of the layers. The controller 44 may be any type of device that includes logic circuitry for executing instructions. Moreover, the controller 44 depicted in FIG. 5 may be a stand-alone controller or it may be one or more of the controllers already resident on either the etching tool 41, the dielectric layer manufacturing tools 47, 47A or the metrology tool 43.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a dielectric stack comprised of multiple layers;

determining a thickness ratio of said layers of said dielectric stack;

determining an etching process to be performed on said dielectric stack to define an opening in said dielectric stack for a conductive interconnection based upon said determined thickness ratio; and performing said determined etching process on said dielectric stack to define said opening.

2. The method of claim 1, wherein forming a dielectric stack comprised of multiple layers above a structure comprises forming a dielectric stack comprised of at least two layers, said layers having different etching rates.

3. The method of claim 1, wherein forming a dielectric stack comprised of multiple layers above a structure comprises forming a dielectric layer comprised of at least one layer of a silane based dielectric material having a dielectric constant less than four and at least one layer of TEOS.

4. The method of claim 1, wherein forming a dielectric stack comprised of multiple layers comprises forming a dielectric stack comprised of multiple layers above a previous layer of conductive interconnections.

5. The method of claim 1, wherein, forming a dielectric stack comprised of multiple layers comprises forming a dielectric stack comprised of multiple layers above a semiconducting substrate.

6. The method of claim 1, wherein determining a thickness ratio of said layers of said dielectric stack comprises:
measuring a thickness of each of said layers and calculating a thickness ratio of said layers based upon said measurements.

7. The method of claim 1, wherein said etching process comprises a timed etch process.

8. The method of claim 1, wherein said etching process comprises an end-point etch process.

9. The method of claim 1, wherein said etching process comprises a timed base etch process and an end-point etch process.

10. The method of claim 1, wherein determining an etching process to be performed on said dielectric stack to define an opening in said dielectric stack for a conductive interconnection based upon said determined thickness ratio comprises determining at least one parameter of an etching process to be performed on said dielectric stack to define an opening in said dielectric stack for a conductive interconnection based upon said determined thickness ratio.

11. The method of claim 1 wherein determining an etching process to be performed on said dielectric stack to define an opening in said dielectric stack for a conductive interconnection based upon said determined thickness ratio comprises determining an adjustment of at least on parameter of an etching process to be performed on said dielectric stack to define an opening in said dielectric stack for a conductive interconnection based upon said determined thickness ratio.

12. The method of claim 1, wherein said conductive interconnection is a conductive line.

13. The method of claim 1, wherein said conductive interconnection is a conductive contact.

14. A method, comprising:
forming a dielectric stack comprised of multiple layers;
measuring a thickness of each of said layers;
calculating a thickness ratio of said layers based upon said measurements;
determining an etching process to be performed on said dielectric stack to define an opening in said dielectric stack for a conductive interconnection based upon said determined thickness ratio; and
performing said determined etching process on said dielectric stack to define said openings.

15. The method of claim 14, wherein forming a dielectric stack comprised of multiple layers comprises forming a dielectric stack comprised of at least two layers, said layers having different etching rates.

16. The method of claim 14, wherein forming a dielectric stack comprised of multiple layers comprises forming a dielectric layer comprised of at least one layer of a silane based dielectric material having a dielectric constant less than four and at least one layer of TEOS.

17. The method of claim 14, wherein forming a dielectric stack comprised of multiple layers comprises forming a dielectric stack comprised of multiple layers above a previous layer of conductive interconnections.

18. The method of claim 14, wherein, forming a dielectric stack comprised of multiple layers above a structure comprises forming a dielectric stack comprised of multiple layers above a semiconducting substrate.

19. The method of claim 14, wherein said etching process comprises a timed etch process.

20. The method of claim 14, wherein said etching process comprises an end-point etch process.

21. The method of claim 14, wherein said etching process comprises a timed base etch process and an end-point etch process.

22. The method of claim 14, wherein determining an etching process to be performed on said dielectric stack to define an opening in said dielectric stack for a conductive interconnection based upon said determined thickness ratio comprises determining at least one parameter of an etching process to be performed on said dielectric stack to define an opening in said dielectric stack for a conductive interconnection based upon said determined thickness ratio.

23. The method of claim 14, wherein determining an etching process to be performed on said dielectric stack to define an opening in said dielectric stack for a conductive interconnection based upon said determined thickness ratio comprises determining an adjustment of at least on parameter of an etching process to be performed on said dielectric stack to define an opening in said dielectric stack for a conductive interconnection based upon said determined thickness ratio.

24. The method of claim 14, wherein said conductive interconnection is a conductive line.

25. The method of claim 14, wherein said conductive interconnection is a conductive contact.

26. A method, comprising:
forming a dielectric stack comprised of multiple layers, each layer having a design thickness;
determining a variation in a thickness of said layers as compared to the design thickness of said layers;
determining an etching process to be performed on said dielectric stack to define an opening for a conductive interconnection based upon the determined variation in thickness of said layers; and
performing said determined etching process to define said openings in said dielectric stack.

27. The method of claim 26, wherein forming a dielectric stack comprised of multiple layers comprises forming a dielectric stack comprised of at least two layers, said layers having different etching rates.

28. The method of claim 26, wherein forming a dielectric stack comprised of multiple layers comprises forming a dielectric layer comprised of at least one layer of a silane based dielectric material having a dielectric constant less than four and at least one layer of TEOS.

29. The method of claim 26, wherein forming a dielectric stack comprised of multiple layers comprises forming a dielectric stack comprised of multiple layers above a previous layer of conductive interconnections.

30. The method of claim 26, wherein, forming a dielectric stack comprised of multiple layers comprises forming a dielectric stack comprised of multiple layers above a semiconducting substrate.

31. The method of claim 26, wherein determining a thickness ratio of said layers of said dielectric stack comprises:

measuring a thickness of each of said layers and calculating a thickness variation of said layers as compared to the design thickness for said layers based upon said measurements.

32. The method of claim 26, wherein said etching process comprises a timed etch process.

33. The method of claim 26, wherein said etching process comprises an end-point etch process.

34. The method of claim 26, wherein said etching process comprises a timed base etch process and an end-point etch process.

35. The method of claim 26, wherein determining an etching process to be performed on said dielectric stack to define an opening in said dielectric stack for a conductive interconnection based upon the determined variation in thickness of said layers comprises determining at least one parameter of an etching process to be performed on said dielectric stack to define an opening in said dielectric stack for a conductive interconnection based upon said determined thickness variation.

36. The method of claim 26 wherein determining an etching process to be performed on said dielectric stack to define an opening in said dielectric stack for a conductive interconnection based upon the determined variation in thickness of said layers comprises determining an adjustment of at least on parameter of an etching process to be performed on said dielectric stack to define an opening in said dielectric stack for a conductive interconnection based upon said determined thickness variation.

37. The method of claim 26, wherein said conductive interconnection is a conductive line.

38. The method of claim 26, wherein said conductive interconnection is a conductive contact.

* * * * *